United States Patent
Tsai et al.

(10) Patent No.: US 8,848,454 B2
(45) Date of Patent: Sep. 30, 2014

(54) METHOD FOR PROGRAMMING NON-VOLATILE MEMORY CELL, NON-VOLATILE MEMORY ARRAY AND NON-VOLATILE MEMORY APPARATUS

(71) Applicant: United Microelectronics Corp., Hsinchu (TW)

(72) Inventors: Feng-Ji Tsai, Hsinchu (TW); Shen-De Wang, Hsinchu County (TW); Wen-Chung Chang, Hsinchu (TW); Ya-Huei Huang, Tainan (TW); Chien-Hung Chen, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 79 days.

(21) Appl. No.: 13/633,732

(22) Filed: Oct. 2, 2012

(65) Prior Publication Data

US 2014/0092689 A1  Apr. 3, 2014

(51) Int. Cl.
*G11C 11/34* (2006.01)

(52) U.S. Cl.
USPC .................................... 365/185.28

(58) Field of Classification Search
USPC .................................................. 365/185.28
See application file for complete search history.

(56) References Cited

U.S. PATENT DOCUMENTS

| | | | |
|---|---|---|---|
| 7,200,045 B2 * | 4/2007 | Lue et al. ................. | 365/185.28 |
| 2006/0146614 A1 * | 7/2006 | Lue et al. ................. | 365/185.28 |
| 2007/0159880 A1 * | 7/2007 | Eitan ............................ | 365/184 |
| 2007/0200180 A1 * | 8/2007 | Irani et al. ..................... | 257/374 |
| 2008/0258205 A1 * | 10/2008 | Ishimaru et al. ............... | 257/324 |
| 2012/0018795 A1 | 1/2012 | Chen et al. | |
| 2012/0127796 A1 * | 5/2012 | Eitan et al. ............... | 365/185.15 |

* cited by examiner

*Primary Examiner* — Huan Hoang
*Assistant Examiner* — Pablo Huerta
(74) *Attorney, Agent, or Firm* — J.C. Patents

(57) ABSTRACT

A method for programming a non-volatile memory cell is described. The memory cell includes a substrate, a gate over the substrate, a charge-trapping structure at least between the substrate and the gate, and first and second S/D regions in the substrate beside the gate. The method includes performing a channel-initiated secondary electron (CHISEL) injection process to inject electrons to the charge-trapping structure.

10 Claims, 2 Drawing Sheets

METHOD FOR PROGRAMMING NON-VOLATILE MEMORY CELL, NON-VOLATILE MEMORY ARRAY AND NON-VOLATILE MEMORY APPARATUS

BACKGROUND OF THE INVENTION

1. Field of Invention

This invention relates to a method for programming a non-volatile memory cell, a non-volatile memory array to which the method is applied suitably, and a non-volatile memory apparatus including the non-volatile memory array.

2. Description of Related Art

Conventionally, a non-volatile memory cell is programmed by channel hot electron (CHE) injection, wherein the substrate is applied with 0V and the gate applied with 7V to turn on the channel, and the two S/D regions are applied with 5V and 0V, respectively, to generate hot electrons in the channel. The hot electrons are then drawn to the charge storage layer by the high positive voltage on the gate.

However, the CHE program method suffers from a longer program time of about 0.5-5 ms, a larger programming current of about 200-300 µA causing larger power consumption, and a poor endurance performance of less than 100 times of program-erase cycling.

SUMMARY OF THE INVENTION

In view of the foregoing, this invention provides a method for programming a non-volatile memory (NVM) cell.

This invention also provides a non-volatile memory array that is suitably programmed using the program method of this invention.

This invention also provides a non-volatile memory apparatus that includes the non-volatile memory array of this invention.

The method for programming a non-volatile memory cell of this invention is applied to a memory cell including: a substrate, a gate over the substrate, a charge-trapping structure at least between the substrate and the gate, and first and second doped regions in the substrate beside the gate. The method includes performing a channel-initiated secondary electron (CHISEL) injection process to inject electrons in the charge trapping structure.

In an embodiment of this invention, the charge-trapping structure has two storage sites, and the CHISEL injection process includes: applying a first positive voltage to the gate, a negative voltage to the substrate, a second positive voltage lower than the first positive voltage to one of the S/D regions, and 0V to the other S/D region to inject electrons to one of the two storage sites.

The non-volatile memory array of this invention includes a plurality of memory cells arranged in rows and columns, a plurality of word lines, a plurality of bit lines, a plurality of select lines, and a plurality of substrate lines. Each memory cell includes: a portion of a substrate, a gate over the portion of the substrate, a charge-trapping structure at least between the substrate and the gate, and first and second S/D regions in the substrate beside the gate. Each word line is coupled with the gates of a row of memory cells. Each bit line is coupled with the first doped regions of a column of memory cells. Each select line is coupled with the second doped regions of a column of memory cells. Each substrate line is coupled with the portions of the substrate of a row of memory cells.

The non-volatile memory apparatus of this invention includes: the non-volatile memory array of this invention, and a logic circuit that performs the CHISEL program method of this invention to the non-volatile memory array.

Because the substrate is applied with a negative voltage in the program method of this invention, a large amount of secondary electrons are induced by impact of the channel hot electrons and drawn to the charge-trapping structure. Hence, the programming time can be much shortened, the programming current can be reduced to decrease power consumption, and the endurance performance can be much improved.

In order to make the aforementioned and other objects, features and advantages of the present invention comprehensible, a preferred embodiment accompanied with figures is described in detail below.

DESCRIPTION OF EMBODIMENTS

It is noted that the following embodiments are intended to further explain this invention but not to limit the scope thereof.

Figure 1:
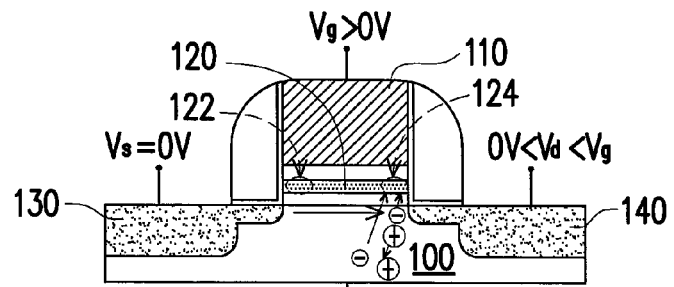
FIG. 1 illustrates a CHISEL program method for a non-volatile memory cell according to an embodiment of this invention.

FIG. 1 illustrates a CHISEL program method for a non-volatile memory cell according to an embodiment of this invention.

Referring to FIG. 1, the non-volatile memory cell includes a portion of a substrate 100, a gate 110, a contiguous planar charge-trapping layer 120 as a charge-trapping structure between the substrate 100 and the gate 110, and two source/drain (S/D) regions 130 and 140, wherein the charge-trapping layer 120 has two separate storage sites 122 and 124. To write the right storage site 124, the gate 110 is applied with a first positive voltage ($V_g$>0V), the portion of the substrate 100 applied with a negative voltage ($V_b$<0V), the right S/D region 140 applied with a second positive voltage lower than the first positive voltage (0V<$V_d$<$V_g$), and the left S/D region 130 applied with 0V ($V_s$=0V), so as to generate secondary electrons in the channel near the right S/D region 140 and inject electrons to the right storage site 124. In an embodiment of the CHISEL program method, $V_g$=5V, $V_b$=−2V and $V_d$=3V.

Moreover, when the left storage site 122 is to be written, the voltage $V_g$ applied to the gate 110 and the voltage $V_b$ to the substrate 100 are not changed, but the voltages applied to the S/D regions 130 and 140 are exchanged with each other. That is, the right S/D region 140 is applied with 0V instead of the second positive voltage, and the left S/D region 130 is applied with the second positive voltage instead of 0V. By doing so, secondary electrons are generated in the channel near the left S/D region 130 and then injected to the left storage site 122.

Figure 2:
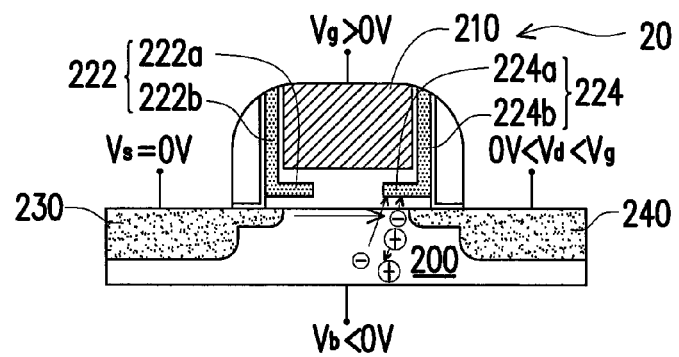
FIG. 2 illustrates a CHISEL program method for another non-volatile memory cell according to another embodiment of this invention.

FIG. 2 illustrates a CHISEL program method for another non-volatile memory cell according to another embodiment of this invention.

Referring to FIG. 2, the non-volatile memory cell 20 includes a portion of a substrate 200, a gate 210 over the portion of the substrate 200, a charge-trapping structure that includes two separate charge-trapping layers 222 and 224 each having at least a portion 222a or 224a between the substrate 200 and the gate 210, and two source/drain (S/D) regions 230 and 240 in the substrate 200 beside the gate 210. The portion of the substrate 200 may be a P-well formed in the substrate 200. The charge-trapping layer 222 has an L-shape, and includes: the portion 222a between the gate 210 and the substrate 200, and another portion 222b on the sidewall of the gate 210. The charge-trapping layer 224 also has an L-shape, and includes: the portion 224a between the gate 210 and the substrate 200, and another portion 224b on the sidewall of the gate 210.

In a CHISEL programming for the right charge-trapping layer 224, the gate 210 is applied with a first positive voltage ($V_g>0V$), the portion of the substrate 200 applied with a negative voltage ($V_b<0V$), the right S/D region 240 applied with a second positive voltage lower than the first positive voltage ($0V<V_d<V_g$), and the left S/D region 230 applied with 0V ($V_s=0V$), so as to generate secondary electrons in the channel near the right S/D region 240 and inject electrons to the right charge-trapping layer 224. In an embodiment of the CHISEL program method, $V_g=5V$, $V_b=-2V$ and $V_d=3V$.

Moreover, when the left charge-trapping layer 222 is to be written, the voltage $V_g$ applied to the gate 210 and the voltage $V_b$ to the substrate 200 are not changed, but the voltages applied to the S/D regions 230 and 240 are exchanged with each other. That is, the right S/D region 240 is applied with 0V instead of the second positive voltage, and the left S/D region 230 is applied with the second positive voltage instead of 0V. By doing so, secondary electrons are generated in the channel near the left S/D region 230 and then injected to the left charge-trapping layer 222.

Figure 3:
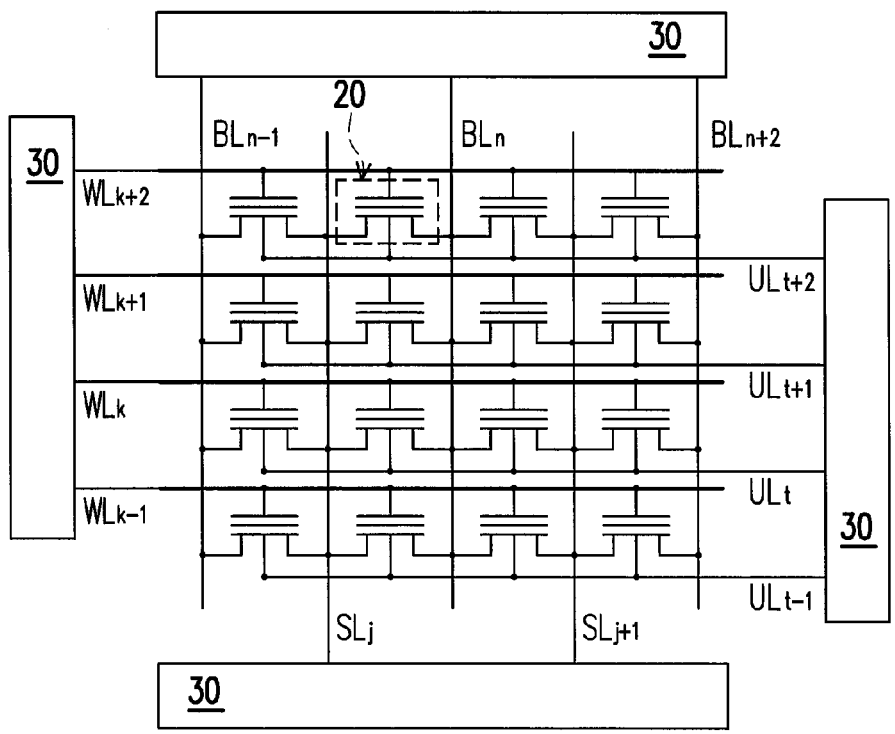
FIG. 3 illustrates a circuit diagram of a non-volatile memory array and a non-volatile memory apparatus according to an embodiment of this invention.

FIG. 3 illustrates a circuit diagram of a non-volatile memory array and a non-volatile memory apparatus according to an embodiment of this invention.

Referring to FIG. 3, the non-volatile memory array includes a plurality of the above memory cells 20 arranged in rows and columns, a plurality of word lines (WL), a plurality of bit lines (BL), a plurality of select lines (SL), and a plurality of substrate lines (UL). The structure of each memory cell 20 has been described above. Each word line (WL) is coupled with the gates of a row of memory cells 20, wherein the gates may be portions of the word line. Each bit line (BL) is coupled with the first S/D regions of a column of memory cells 20. Each select line (SL) is coupled with the second S/D regions of a column of memory cells 20. Each substrate line (UL) is coupled with the portions of the substrate of a row of memory cells 20, wherein the portions of the substrate may be portions of a linear P-well corresponding to the row of memory cells 20. In such a case, the substrate voltage of any row of memory cells 20, which is provided from one corresponding substrate line (UL), can be set independently from other rows of memory cells as long as any two neighboring linear P-wells are isolated from each other.

The non-volatile memory apparatus of this embodiment includes: the above non-volatile memory array, and a logic circuit 30 for performing the CHISEL program method of this embodiment. The logic circuit 30 is configured to apply a first positive voltage to the word line (WL) coupled to the gates of the row of memory cells 20 including the selected cell, apply a negative voltage to the substrate line (UL) coupled to the portions of the substrate of the row of memory cells 20, apply a second positive voltage lower than the first positive voltage to the bit line (BL) coupled to the written-side S/D region of the selected cell and the corresponding S/D regions of the other cells 20 in the same column of memory cells 20, and apply 0V to the select line (SL) coupled to the other S/D regions of the column of memory cells 20, for CHISEL programming.

For example, when the right bit of the marked cell 20 in FIG. 3 is selected to be written with CHISEL, the logic circuit 30 applies a first positive voltage to the word line $WL_{k+2}$ coupled to the gate of the selected cell 20, a negative voltage to the substrate line $UL_{t+2}$ coupled to the portion of the substrate of the selected cell 20, a second positive voltage lower than the first positive voltage to the bit line $BL_n$ coupled to the written-side S/D region of the selected cell 20, and 0V to the select line $SL_S$ coupled to the other S/D region of the selected cell 20.

Figure 4:
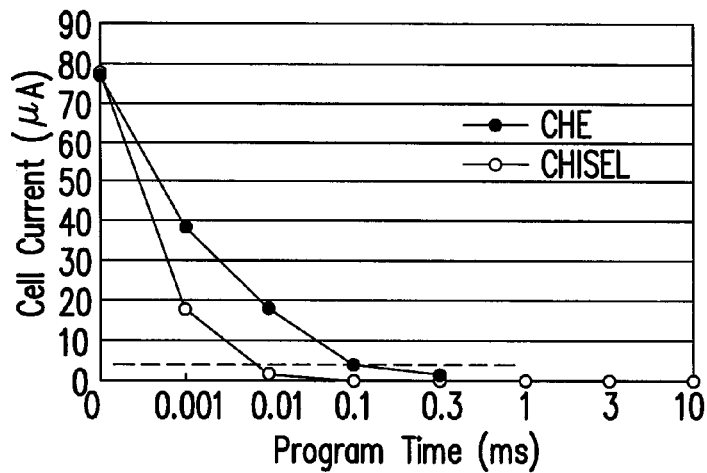
FIG. 4 shows the result of a first experiment for comparing the program time of the CHISEL program method of this invention with that of the conventional CHE program method.

FIG. 4 shows the result of the first experiment for comparing the program time of the CHISEL program method of this invention with that of the conventional CHE program method. The CHISEL program method and the CHE program method were both applied to a memory cell as shown in FIG. 2. In the CHESEL program method, the bias configuration is: $V_g=5V$, $V_b=-2V$, $V_d=3V$ and $V_s=0V$. In the conventional CHE program method, the bias configuration is: $V_g=7V$, $V_b=0V$, $V_d=5V$ and $V_s=0V$.

As shown in FIG. 4, the CHISEL program method of this invention is more rapid than the conventional CHE program method, by about one order of magnitude.

Figure 5:
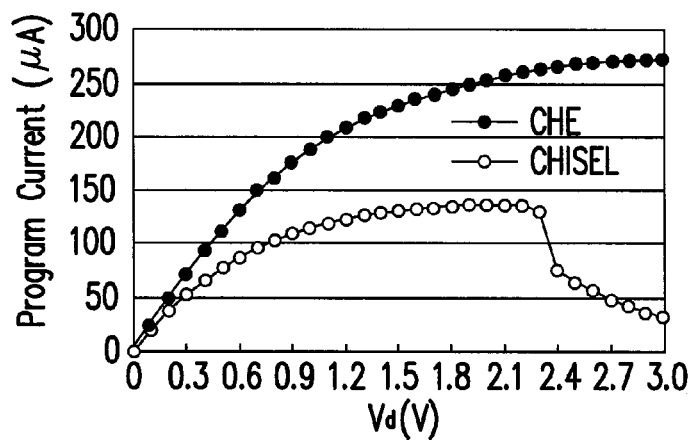
FIG. 5 shows the result of a second experiment for comparing the program current of the CHISEL program method of this invention with that of the conventional CHE program method.

FIG. 5 shows the result of the second experiment for comparing the program current of the CHISEL program method of this invention with that of the conventional CHE program method. The two memory cells to which the two program methods were applied respectively were the same as those used in the first experiment.

As shown in FIG. 5, the program current of the CHISEL program method of this invention is smaller by about 150 µA than that of the conventional CHE program method, which means a remarkably less power consumption.

Figure 6:
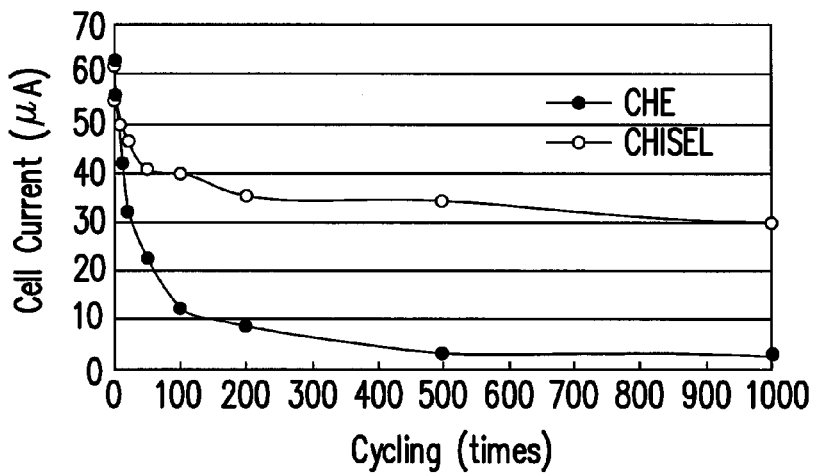
FIG. 6 shows the result of a third experiment for comparing the endurance performance of the CHISEL program method of this invention with that of the conventional CHE program method.

FIG. 6 shows the result of the third experiment for comparing the endurance performance of the CHISEL program method of this invention with that of the conventional CHE program method. The two memory cells to which the two program methods were applied were the same as those used in the first experiment.

As shown in FIG. 6, after 1000 program-erase cycles, the memory cell programmed by the CHISEL program method of this invention had better performance than the memory cell programmed by the conventional CHE program method, and the former memory cell also had a large Vt window than the latter memory cell.

Accordingly, by applying the CHISEL program method of this invention to non-volatile memory cells, the program time can be much shortened, the program current can be reduced to decrease the power consumption, and the endurance performance can also be much improved.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method for programming a non-volatile memory cell, wherein the memory cell comprises: a substrate, a gate over the substrate, a charge-trapping structure at least between the substrate and the gate, and first and second source/drain (S/D) regions in the substrate beside the gate, wherein the charge-trapping structure includes two separate charge-trapping layers each having an L-shape that includes: a portion between the substrate and the gate, and another portion on a sidewall of the gate, the method comprising:

performing a channel-initiated secondary electron (CHISEL) injection process to inject electrons to the charge-trapping structure.

2. The method of claim 1, wherein the charge-trapping structure has two storage sites, and the CHISEL injection process comprises: applying a first positive voltage to the gate, a negative voltage to the substrate, a second positive voltage lower than the first positive voltage to the first S/D region, and 0V to the second S/D region to inject electrons to one of the two storage sites.

3. The method of claim 2, wherein the CHISEL injection process further comprises: applying 0V to the first S/D region and the second positive voltage to the second S/D region to inject electrons to the other of the two storage sites.

4. The method of claim 1, wherein the two another portions are located on the first and second source/drain (S/D) regions respectively.

5. A non-volatile memory array, comprising:

a plurality of memory cells arranged in rows and columns, wherein each memory cell comprises: a portion of a substrate, a gate over the portion of the substrate, a charge-trapping structure at least between the substrate and the gate, and first and second doped regions in the portion of the substrate beside the gate, wherein the charge-trapping structure includes two separate charge-trapping layers each having an L-shape that includes: a portion between the substrate and the gate, and another portion on a sidewall of the gate;

a plurality of word lines, each coupled with the gates of a row of memory cells;

a plurality of bit lines, each coupled with the first doped regions of a column of memory cells;

a plurality of select lines, each coupled with the second doped regions of a column of memory cells; and a plurality of substrate lines, each coupled with the portions of the substrate of a row of memory cells.

6. The non-volatile memory array of claim 5, wherein a column of memory cells shares a bit line with a neighboring column of memory cells, and shares a select line with another neighboring column of memory cells.

7. A non-volatile memory apparatus, comprising:

the non-volatile memory array of claim 5; and a logic circuit for programming the non-volatile memory array through channel-initiated secondary electron (CHISEL) injection.

8. The non-volatile memory apparatus of claim 7, wherein the charge-trapping structure has two storage sites, and the logic circuit is configured to, in the CHISEL injection to one of the two storage sites of the charge-trapping structure of a selected cell, apply a first positive voltage to the word line coupled to the gates of the row of memory cells including a selected cell, apply a negative voltage to the substrate line coupled to the portions of the substrate of the row of memory cells, apply a second positive voltage lower than the first positive voltage to the bit line coupled to the S/D region of the selected cell near the one storage site, and apply 0V to the select line coupled to the other S/D region of the selected cell.

9. The method of claim 5, wherein the two another portions are located on the first and second source/drain (S/D) regions respectively.

10. The non-volatile memory apparatus of claim 7, wherein the two another portions are located on the first and second source/drain (S/D) regions respectively.

* * * * *